United States Patent
Kudo et al.

(10) Patent No.: US 6,799,157 B1
(45) Date of Patent: Sep. 28, 2004

(54) METHOD FOR IMPROVING PIN COMPATIBILITY IN MICROCOMPUTER EMULATION EQUIPMENT

(75) Inventors: Makoto Kudo, Fujimi-machi (JP); Hirofumi Terasawa, Fujimi-machi (JP); Yoshiyuki Miyayama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/532,514

(22) Filed: Mar. 21, 2000

(30) Foreign Application Priority Data

Mar. 23, 1999 (JP) .......................................... 11-078066

(51) Int. Cl.[7] .............................................. G06E 7/60
(52) U.S. Cl. .......................... 703/28; 703/23; 703/24; 712/209; 712/23
(58) Field of Search .............................. 703/23, 24, 28; 712/209, 23

(56) References Cited

U.S. PATENT DOCUMENTS

| | | | | |
|---|---|---|---|---|
| 4,780,819 A | * | 10/1988 | Kashiwagi | 703/23 |
| 4,868,822 A | * | 9/1989 | Scott et al. | 714/29 |
| 4,939,637 A | * | 7/1990 | Pawloski | 703/26 |
| 5,062,034 A | * | 10/1991 | Bakker | 703/23 |
| 5,313,618 A | * | 5/1994 | Pawloski | 703/28 |
| 5,515,525 A | * | 5/1996 | Grynberg et al. | 703/27 |
| 5,623,673 A | * | 4/1997 | Gephardt et al. | 710/260 |
| 5,640,542 A | * | 6/1997 | Whitsel et al. | 703/28 |
| 5,669,009 A | * | 9/1997 | Buktenica et al. | 712/35 |
| 5,781,750 A | * | 7/1998 | Blomgren et al. | 712/209 |
| 5,794,063 A | * | 8/1998 | Favor | 712/23 |
| 5,809,559 A | * | 9/1998 | Kim | 711/202 |
| 5,819,065 A | * | 10/1998 | Chilton et al. | 703/24 |
| 6,075,941 A | * | 6/2000 | Itoh et al. | 717/128 |
| 6,185,522 B1 | * | 2/2001 | Bakker | 703/28 |
| 6,240,377 B1 | * | 5/2001 | Kai et al. | 703/24 |

FOREIGN PATENT DOCUMENTS

| | | | |
|---|---|---|---|
| EP | 0 789 311 A2 | * 8/1997 | ........... G06F/17/50 |
| JP | A 58-003054 | 1/1983 | |
| JP | A 03-201036 | 9/1991 | |

* cited by examiner

*Primary Examiner*—Kevin J. Teska
*Assistant Examiner*—Fred Ferris
(74) *Attorney, Agent, or Firm*—Oliff & Berridge, PLC

(57) ABSTRACT

An objective is to provide a microcomputer, electronic equipment and emulation method which can realize the optimum circumstance of evaluation while saving the number of terminals. An external bus is shared between external and emulation memories. In the emulation mode, the access of CPU to an internal ROM is switched to the access of CPU to the emulation memory through an external bus. The emulation mode is turned ON or OFF through a mode selection terminal or mode selection register. The emulation memory is controlled by a control signal CNT2 different from a control signal CNT1 which controls the external memory. A memory read signal in CNT2 become active at a timing earlier than that of a memory read signal in CNT1. Thus, the instruction is fetched and decoded within one clock cycle. A mode selection terminal is further provided for selecting a mode of performing the boot from the emulation memory, internal ROM or external memory and a made of selecting OPT mode.

25 Claims, 9 Drawing Sheets

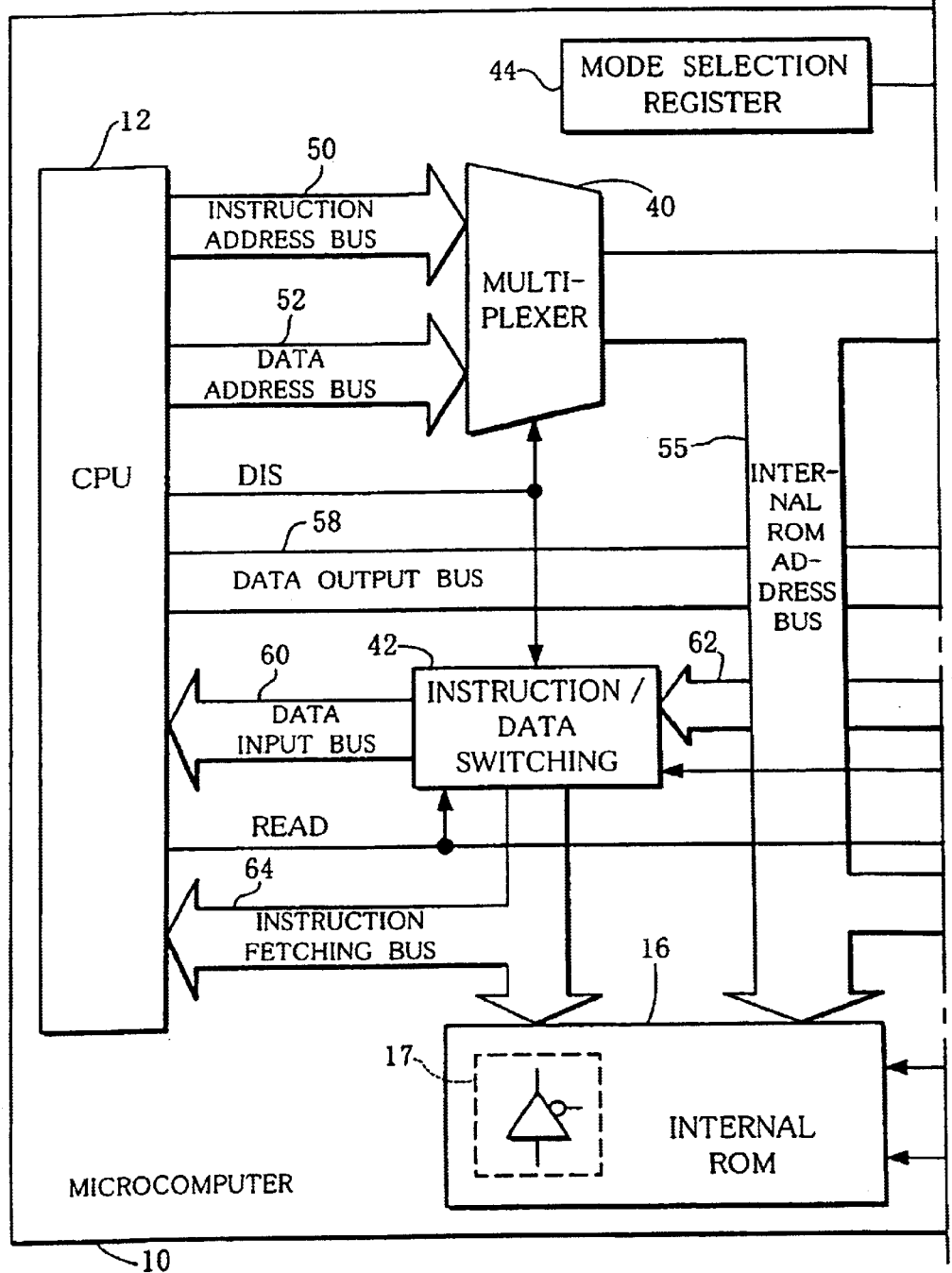

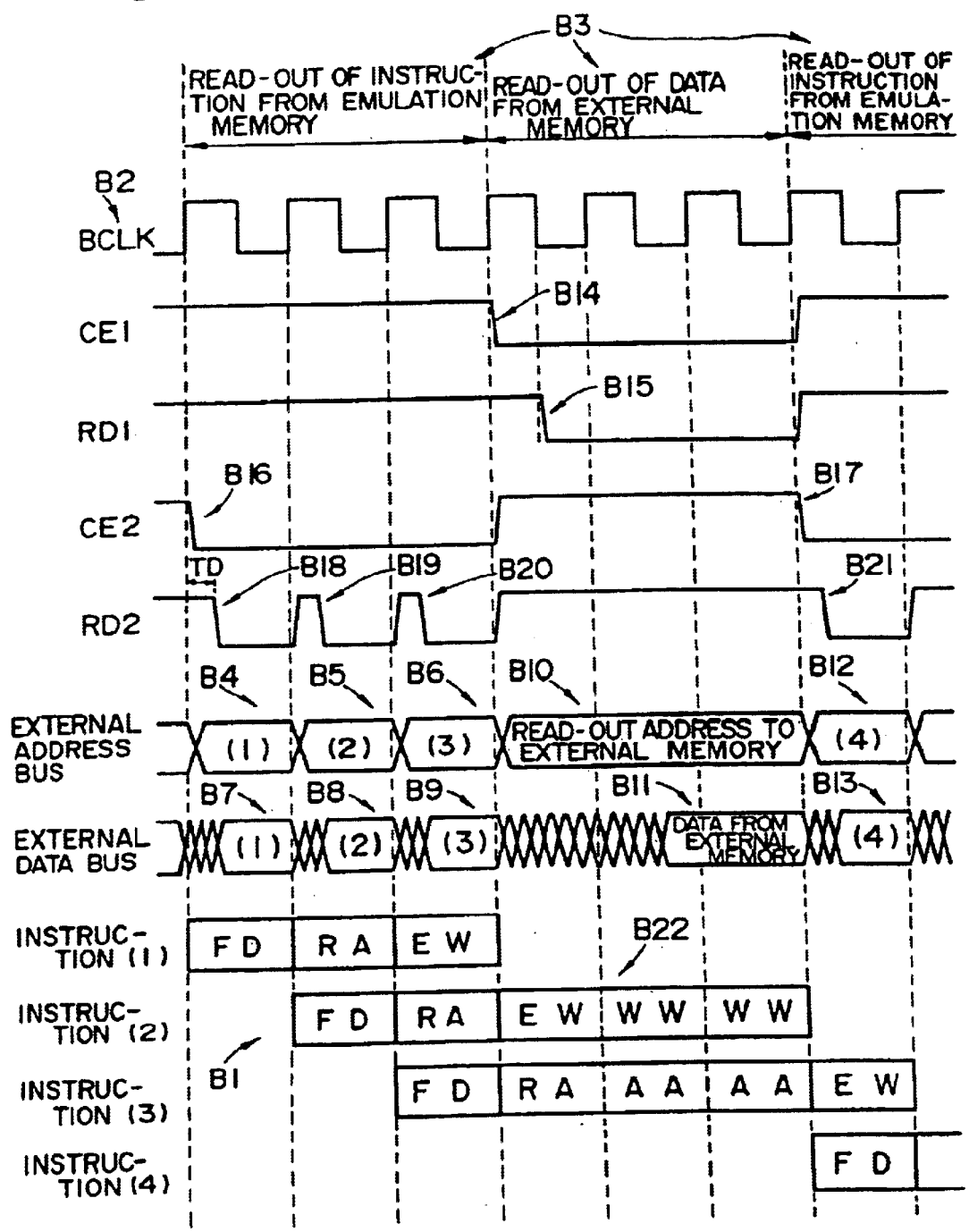

FIG.5

| TERMINAL MT | |
|---|---|
| 0 0 | BOOTING FROM EMULATION MEMORY |
| 0 1 | BOOTING FROM EMULATION MEMORY AFTER INFORMATION HAS BEEN TRANSFERRED TO EMULATION MEMORY (OTP MODE) |
| 1 0 | BOOTING FROM INTERNAL ROM |
| 1 1 | BOOTING FROM EXTERNAL MEMORY |

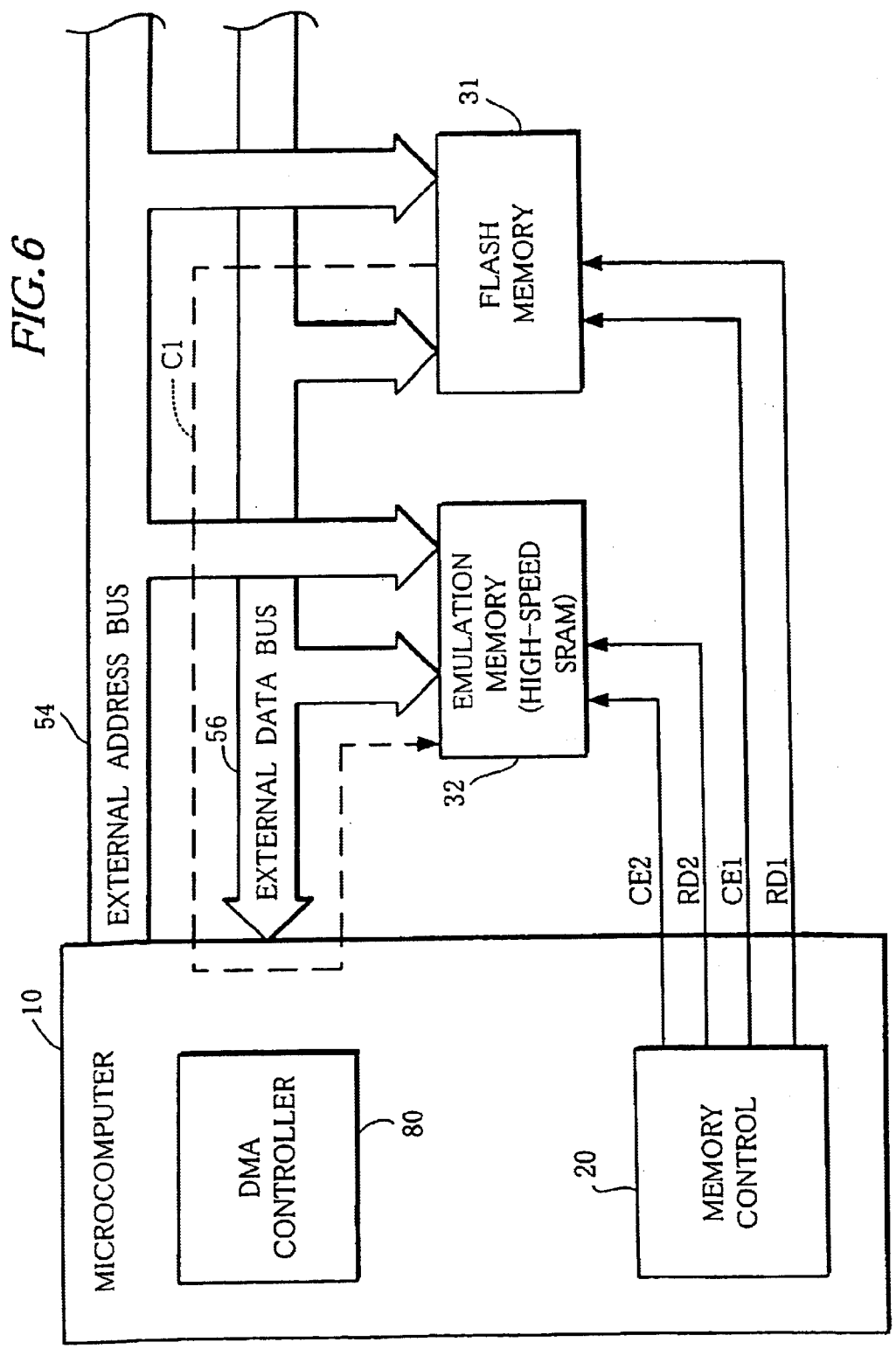

METHOD FOR IMPROVING PIN COMPATIBILITY IN MICROCOMPUTER EMULATION EQUIPMENT

BACKGROUND OF THE INVENTION

1. Field of the Invention

The present invention relates to a microcomputer, electronic equipment and emulation method.

2. Description of the Related Art

In recent years, there is an increased demand for microcomputers which can be incorporated into electronic equipment such as domestic game machines, car-navigation systems, printers, portable information terminals, portable telephones and which can realize a high information processing.

For such microcomputers, such a mass-produced product chip 700 as shown in FIG. 1A is made while at the same time such an evaluation chip 710 for program or system development as shown in FIG. 1B is formed. This evaluation chip 710 comprises normal external address and external data buses 702, 704 connected to an external memory 706 such as a general-purpose memory, and dedicated address and data buses 712, 714 to an emulation memory (or a memory for emulating an internal ROM 718) 716. More particularly, during development of a program, it is stored in the emulation memory 716 such as high-speed SRAM, without being stored in the internal ROM 718. After the developed program has completely been debugged, the finished program will be stored in the internal ROM 718. Because when the not-finished program is stored in the internal ROM 718 and the program has any change, the master pattern in the internal ROM 718 must be modified to renew it.

Thus, the evaluation chip 710 is provided with the address and data buses 712, 714 dedicated to the emulation memory 716. In this case, the number of pins in the evaluation chip 710 will increase in comparison with the number of terminals (or pins) in the product chip 700. It is thus difficult to acquire a package in which the evaluation chip 710 can be mounted or it is complicated to keep the compatibility of terminals between the product and evaluation chips 700, 710. A further problem is that the program normally operated in the evaluation chip 710 will not operate in the product chip 700.

SUMMARY OF THE INVENTION

In view of the technical problems of the prior art, it is an object of the present invention to provide a microcomputer, electronic equipment and emulation method which can realize the optimum circumstance of evaluation while saving the number of terminals.

To this end, one aspect of the present invention provides a microcomputer for performing information processing, comprising: a processor for executing instructions; an external bus being connectable to an emulation memory and at least one external memory other than the emulation memory; and bun control means for connecting a bus of the processor to the external bus so that an access of the processor to an internal memory will be switched to an access to the emulation memory through the external bus when the microcomputer is in an emulation mode.

The external bus (or external bus terminal) is provided to be connectable to the external memory and the emulation memory. Thus, the external bus can be shared between the external memory and emulation memory. When the emulation mode is ON, the access of the processor to the internal memory is switched to the access to the emulation memory through the external bus. Therefore, the processor operates based on the information stored in the internal memory when the emulation mode is OFF, while the processor operates based on the information stored in the emulation memory when the emulation mode is ON. Consequently, it is possible to perform an evaluation such as program development by the use of the emulation memory. In addition, the emulation memory in accessed through the external bus for the other external memory without providing any bus dedicated to the emulation memory. Although particularly not restricted, the same configuration can be used between the terminals of the evaluation and product microcomputers. This can realize the optimum circumstance of evaluation while saving the number of terminals in the microcomputer.

The external bus is sufficient to connect with the external memory and the emulation memory. Thus, in the finished product, for example, it is not necessary to connect the emulation memory with the external bus.

The access of the processor to the internal memory is sufficient to the access to any area of memory space to which the internal memory has been allocated. Thus, when the microcomputer is on evaluation, for example, it is not necessary that the internal memory is actually included in the microcomputer.

The present invention can equivalently be applied to microcomputers which are to arbitrarily exclude the necessary circuit for emulation or to cancel the emulation function, when the microcomputer is on production.

The microcomputer of the present invention may comprise a made selection terminal for selecting ON or OFF of the emulation mode. Thus, the emulation mode can be turned off when the microcomputer is on mass production without re-writing information such as a program stored in the internal memory or the like.

The microcomputer of the present invention may further comprise a mode selection register for storing information used to select ON or OFF of the emulation mode, and being accessible by the processor. Thus, the emulation mode can be switched from ON to OFF or vice versa in a software manner without changing the signal setting to the terminals of the microcomputer.

An address bus of the processor may be connected to an external address bus and an address bus of the internal memory without dependent on ON/OFF of the emulation mode, and a data bus of the processor may be connected to an external data bus when the emulation mode becomes ON.

The microcomputer of the present invention may further comprise memory control means for outputting a first control signal for controlling the external memory connected to the external bus and a second control signal for controlling the emulation memory connected to the external bus, the second control signal being different from the first control signal. Thus, the emulation memory can be controlled by the second control signal which is different from the first control signal for controlling the external memory. Consequently, the emulation memory can properly be accessed even through the external bus to which the external memory is connected.

In the microcomputer of the present invention, the second control signal may include a second memory read signal which becomes active at a timing earlier than that of a first memory read signal included in the first control signal. Thus, the microcomputer can easily deal with such a constraint that the processor must fetch and decode an instruction stored in the emulation memory within one clock cycle, for example.

The microcomputer of the present invention may further comprise a mode selection terminal for selecting a first mode and a second mode, the emulation memory being first accessed by the processor after reset in the first mode, and the internal memory being first accessed by the processor after reset in the second mode. Thus, the first mode can be selected when the microcomputer is on evaluation while the second mode can be selected when the microcomputer is on production (or on actual operations). This can improve the efficiency on evaluation such as program development or the like.

In the microcomputer of the present invention, the mode selection terminal may be capable of selecting a third mode in which the external memory is first accessed by the processor after reset Thus, the microcomputer can be booted from the external memory to meet the requirements of broadly ranging users.

In the microcomputer of the present invention, the mode selection terminal may be capable of selecting a fourth mode in which information is transmitted from the external memory to the emulation memory after reset and thereafter the emulation memory is first accessed by the processor. This can avoid such a complicated operation that information must be downloaded to the emulation memory each time when information has disappeared from the emulation memory. This can improve the efficiency in the evaluation.

Another aspect of the present invention provides electronic equipment comprising any of the aforementioned microcomputers, an input source of information to be processed by the microcomputer, and an output device for outputting the information processed by the microcomputer. Thus, the product microcomputer incorporated into the electronic equipment can have the same configuration (some design or same chip) as in the evaluation. This can reduce the cost and improve the reliability in the electronic equipment. The evaluation executed through the microcomputer incorporated into the electronic equipment can be improved in efficiency.

Further aspect of the present invention provides an emulation method for a microcomputer comprising a processor for executing instructions, and an external bus being connectable to an emulation memory and at least one external memory other than the emulation memory, the external bus is shared between the emulation memory and the external memory and the emulation memory is accessed through the external bus when the microcomputer is on evaluation, thereby causing the processor to operate according to information read out from the emulation memory, and the processor is operated according to information read out from the Internal memory when the microcomputer is on production.

In this aspect, when the microcomputer in on evaluation, the emulation memory is accessed through the external bus to which the external memory Is connected. Thus, the evaluating operation such as&program development or the like can be performed by using the emulation memory. Therefore, the emulation memory can be accessed through the external bus for other external memory without any bus dedicated to the emulation memory. Although particularly not limited, the terminal, of the evaluation and product microcomputers can have the same configuration. This can realize the optimum circumstance of evaluation while saving the number of microcomputer terminals.

BRIEF DESCRIPTION OF THE DRAWINGS

FIG. 4 is a block of signal waveform for illustrating the operation of the microcomputer according to the present embodiment;

FIG. 5 is a view illustrating various modes which can be set by the mode selection terminal MT;

FIG. 6 in a view illustrating OPT mode;

DETAILED DESCRIPTION OF THE PREFERRED EMBODIMENTS

The preferred embodiment of the present invention will now be described with reference to the accompanying drawings.

1. MICROCOMPUTER

Figure 2:
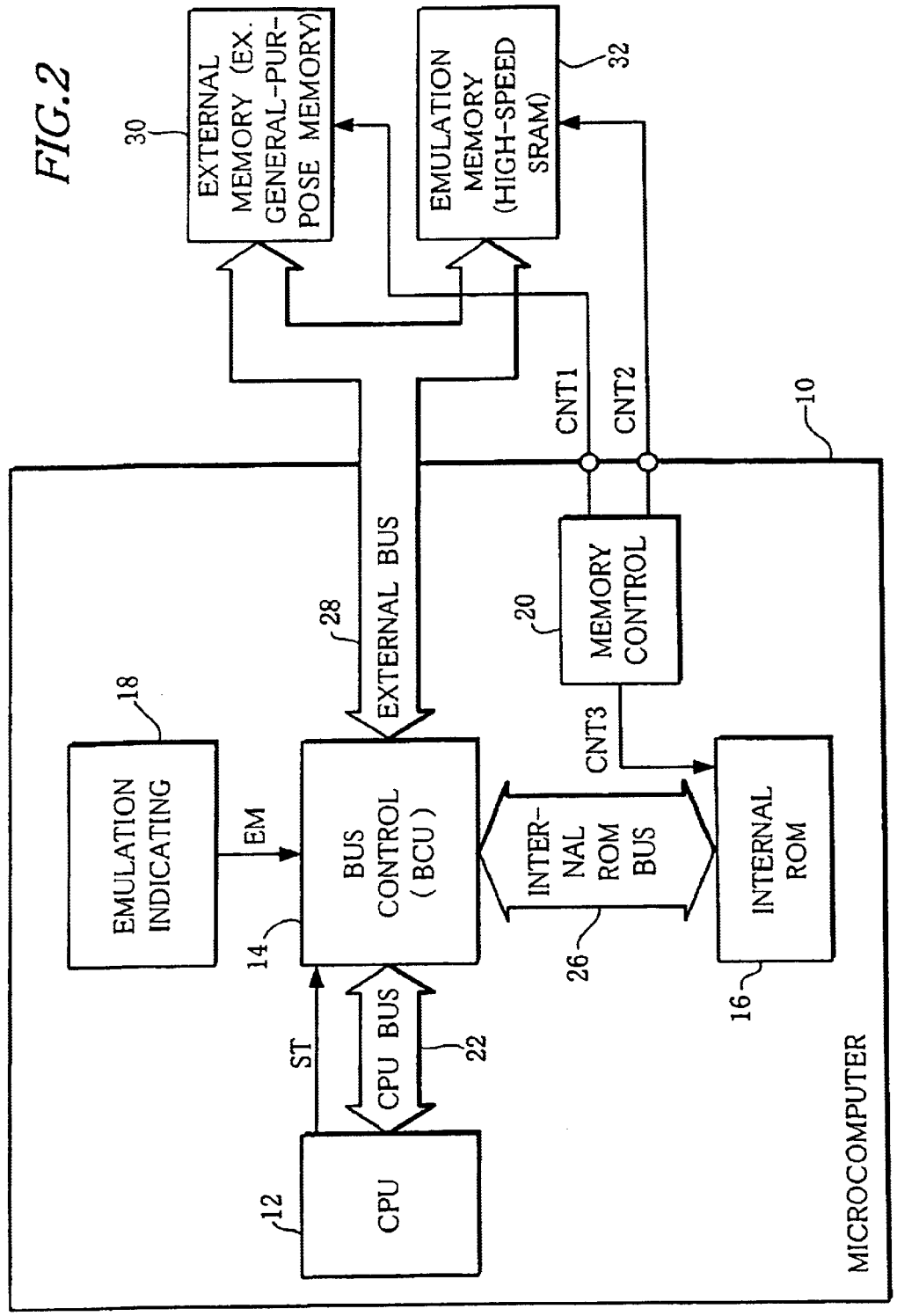
FIG. 2 is a block diagram shoving a structure of a microcomputer according to one embodiment of the present invention.

FIG. 2 is a block diagram showing a microcomputer according to one embodiment of the present invention.

The microcomputer shown in FIG. 2 comprises a CPU (which is a processor, in a broad sense) 12, a bus control unit (BCU) 14, an internal ROM (which is an internal memory, in a broad sense) 16, an emulation indicating unit 18 and a memory control unit 20. The microcomputer also comprises an external bus (or external bus terminal) 28 which Is connectable to an external memory 30 such as a general-purpose memory (e.g., flash memory or DRA) and an emulation memory 32 which is formed by a high-speed SRAM or the like. The external bus 28 may be connected to any other external device such as a gate array or the like.

The CPU 12 executes instructions, with the CPU bus 22 thereof being connected to the bus control unit 14. In addition, a status signal ST from the CPU 12 is outputted toward the bus control unit 14. The internal ROM 16 is to store information of program and data and includes an internal ROM bus 26 which is connected to the bus control unit 14. The internal ROM 16 may not be included in the microcomputer 10 at the time of the evaluation or the like.

The emulation indicating unit 18 makes an emulation indicating signal EM active to instruct the bus control unit 14 for emulation when the emulation mode is ON. In such a case, the emulation mode may be switched from ON to OFF or vice versa by controlling a mode selection terminal provided in the microcomputer 10 or by controlling information stored in a mode selection register provided in the microcomputer 10.

The memory control unit outputs various types of control signals CNT1, CNT2 and CNT3 (such as chip enable signal, memory read signal) for controlling the external memory 30, emulation memory 32 and internal ROM 16. This embodiment is particularly characterized in that the control signals CNT1 and CNT2 different from each other are respectively outputted toward the external memory 30 and emulation memory 32 which are connected to the same external bus 28.

The bus control unit 14 controls the CPU bus 22, internal ROM 26, external bus 28 and so on. The bus control unit 14 performs controls such as connecting the internal ROM bus 26 of the internal ROM 16 to the CPU bus 22, and connecting the external bus 28 connected to the external memory 30 and emulation memory 32 to the CPU bus 22, based on the address or status signal ST from the CPU 12.

When it is indicated by the signal EM from the emulation indicating unit 18 that the emulation mode (which is a mode for causing the emulation memory 32 to emulate the internal ROM 16) is ON, the bus control unit 14 switches the access to the internal ROM 16 of the CPU 12 to the access to the emulation memory 32 through the external bus 28. In other words, the CPU bus 22 is connected to the external bus 28 rather than the internal ROM bus 26 to switch the access of the CPU 12 to the internal ROM 16 through the CPU bus 22 and internal ROM bus 26 into the access to the emulation memory 32 through the CPU bus 22 and external bus 28.

Thus, the CPU 12 will operate according to a program stored in the emulation memory 32, rather than a program (or data) stored in the internal ROM 16. As a result, the user can download a program being developed into the emulation memory 32 for advancing the development of programs. After completion of the program development, the finished program is stored in the internal ROM 16 to provide the final product chip.

Figure 1A:
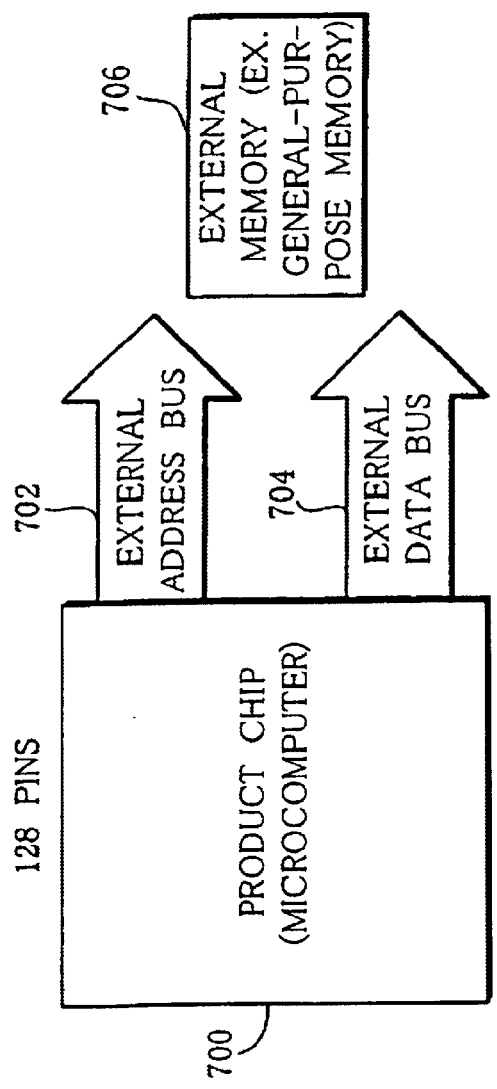
FIGS. 1A and 1B illustrate a conventional technique In which separate chips are used for production and evaluation.
Figure 1B:
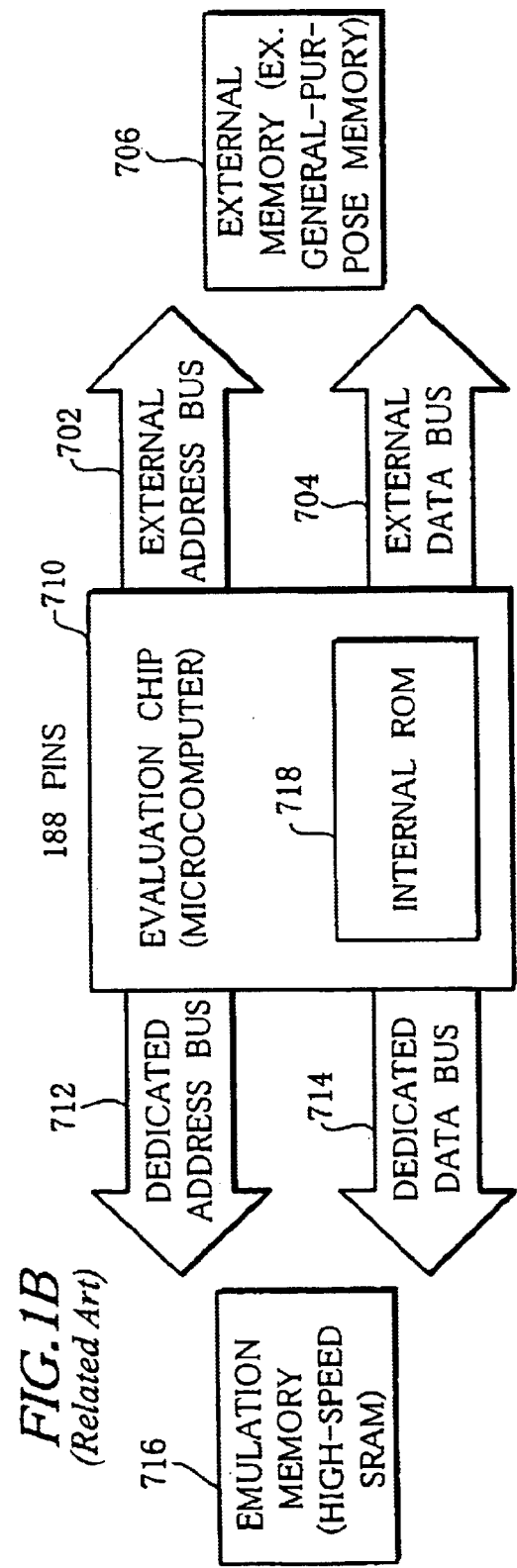

In this embodiment, the external bus 28 is shared between the external memory 30 and emulation memory 32. Therefore, such address and data bus is 712, 714 dedicated to the emulation memory 716 as shown in FIG. 1B may be omitted. This provides the same number of terminals (or pins) between the product and evaluation chips. Since the product chip is used as an evaluation chip, the manufacturing cost can be reduced.

According to this embodiment, it is not necessary to provide labor and time required to prepare a separate package for the evaluation chip, to take an alignment between the product and evaluation chips and so on.

Since the product chip can be used as an evaluation chip, according to this embodiment, there is no problem that a program normally operated in the evaluation chip will not be capable of normally operating in the product chip. More particularly, when the number of terminals (or pins) is different between the evaluation and product chips, the layout of pads (including input pads, output pads and input/output pads) connected to the terminals and the wiring of signal lines to the pads will also be different between the evaluation and product chips. In such a case, the delay times of the signals passing through these signal lines will also be different from one another. As a result, for example, there will be raised a problem in that the product chip can operate with a higher clock frequency while the evaluation chip cannot operate with such a clock frequency. Thus, the evaluation chip must be caused to be operated with a lower clock frequency. The development of program will be forced to be performed in an undesirable circumstance different from that in the actual operation and at a signal timing different from that of the actual operation.

On the contrary, this embodiment can be used to perform the development of program in the same circumstance and signal timing as in the actual operation, since the product chip can be used as an evaluation chip as it is. As a result, the reliability in the product chip can be improved while reducing the time required by the development of program and the manufacturing cost.

When the access to the internal ROM 16 of the CPU12 is switched to the access to the emulation memory 32, it is sufficient that the access is performed to the area of memory space allocated to the internal ROM 16. For example, it is assumed that the internal ROM 16 is included in the microcomputer 10 during the evaluating operation or the like. Since in such a case, the internal ROM 16 does not physically exist, the CPU 12 can only access to the area of memory space allocated to the internal ROM 16.

When the external bus is shared between the external memory 30 and emulation memory 32, as shown in FIG. 2, the following problem will be raised.

The fetching and decoding of an instruction (or program) stored in the internal ROM 16 must be completed within one clock cycle. On emulation mode, therefore, the instruction of the emulation memory 32 is required to be fetched and decoded within one clock cycle.

However, the external bus 28 is not dedicated to the emulation memory 32, unlike the structure of FIG. 1B. When the emulation memory 32 is to be controlled in the exact same manner as in the other external device 30, the instruction will not be able to be fetched and decoded within one clock cycle. Particularly, as the clock frequency increases, such a problem is increasingly serious. It is probably impossible to develop a program using the emulation memory 32 with such a clock frequency as in the actual operation.

To this end, this embodiment provides the control signal CNT 2 different from the other control signal CNT1 for controlling the external memory 30. This control signal CNT2 is used to control such as the reading-out from the emulation memory 32. More particularly, the control signal CNT2 in controlled such that the memory read signal included therein becomes active at a timing earlier than that of the memory read signal included in the control signal CNT1. Thus even though the external bus 28 is shared between the external and emulation memories 30, 32, the instruction can completely be fetched and decoded within one clock cycle. As a result, the development of program using the emulation memory 32 can more easily be performed with the same clock frequency as in the actual operation.

Figure 3B:
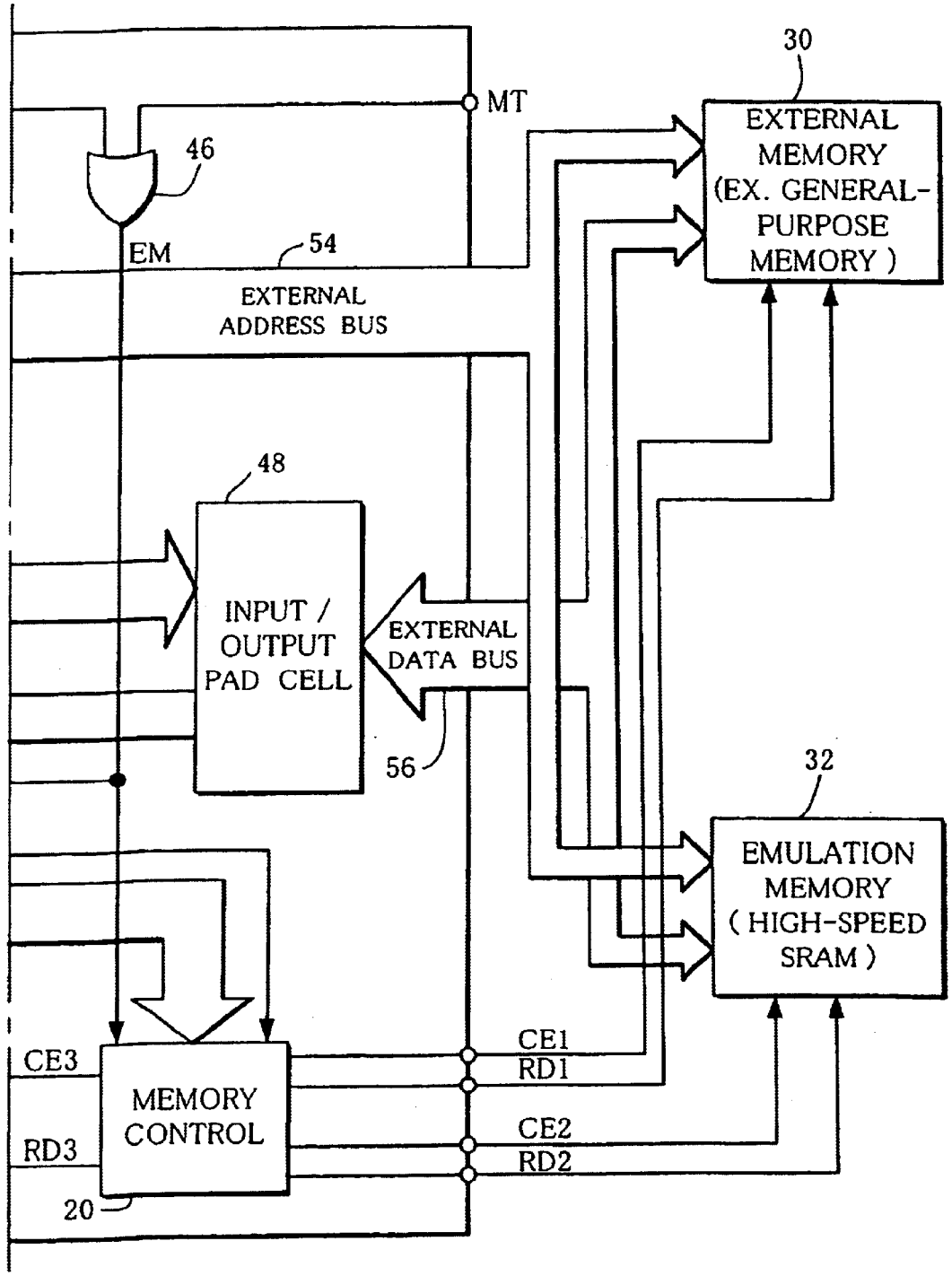
FIG. 3 is a block diagram of the further detailed structure of the microcomputer of the present embodiment.

FIG. 3 is a block diagram of the details of the microcomputer according to this embodiment.

In this arrangement, the CPU 12 applies Harvard architecture bus. The CPU 12 comprises instruction address bus 50 and data address bus 52 which are connected to a multiplexer 40. The multiplexer 40 selects either one of the addresses from the instruction address bus 50 and data address bus 52, according to an instruction/data switching signal DIS (which is one of the status signals) from the CPU 12, and outputs the selected address toward an external address bus 54.

In the arrangement of FIG. 3, the instruction address bus 50 and data address bus 52 from the CPU 12 are connected to both of an external address bus 54 and internal ROM address bus 55, without dependent on the ON/OFF state of the emulation mode.

The CPU 12 further comprises a data output bus 58 connected to an external data bus 56 through an input/output pad cell 48, and a data input bus 60 connected to the external data bus 56 through an instruction/data switching unit 42, data bus 62 and input/output pad cell 48.

The CPU 12 further comprises an instruction fetching bus 64 which is connected to the internal ROM 16 and also to the external data bus 56 through the instruction/date switching unit 42, data bus 62 and input/output pad cell 48.

The memory control unit outputs a first chip enable signal CE1 and a first memory read signal RD1 toward the external memory 30. The memory control unit also outputs a second chip enable signal CR2 and a second memory read signal RD2 different from the first signals CE1 and RD1 toward the emulation memory 32, respectively. The memory control unit further outputs a third chip enable signal CE3 and a third memory read signal RD3 toward the internal ROM 16. Thus, the memory control unit 30 will use these signals CE1, RD1, CE2, RD2, CE3 and RD3 to control the reading and other operations from the external memory 30, emulation memory 32 and internal ROM 16.

Mode selection terminal MT, mode selection register 44 and OR circuit 46 correspond to the emulation indicating unit 18 shown in FIG. 2. When the terminal MT becomes H-level or the mode selection register 44 stores H-level, the emulation indicating signal EM becomes H-level. Thus, the bus switching control will be performed for the emulation mode.

The CPU 12 can access to the mode selection register 44 through a not-shown bus. In other words, the information of the mode selection register 44 can be re-written in a software manner. For example, a user who develops a program using the microcomputer 10 mounted on a system board (or circuit board) may not want to switch a signal to be provided to the terminal MT from H-level to L-level (or to turn off the emulation mode) after completion of the program development. When the level of signal in the terminal MT is changed, the operational circumstance is also changed, resulting in the system which operated before change of the signal level may not operate properly. Furthermore, the change of signal level at the terminal MT may lead to increase of the manufacturing cost. Therefore, a need by such a user can be satisfied by providing the mode selection register 44 which can be accessed by the CPU 12. Using the mode selection register 44, the emulation mode can be ON/OFF controlled by a program in a software manner, without change of the signal level at the terminal MT.

On the other hand, there may be a user who never wants to re-write a program after completion of the program development. When the mode selection register 44 is used, it is required to re-write the program after completion of the program development so that the emulation mode will be turned off. However, such a re-writing of program may create any new bug. With such a user who never wants the creation of such a bug and re-writing of program after completion of the program, its need can be satisfied by providing the terminal MT. Using the terminal MT, the emulation mode can be ON/OFF controlled in a software manner merely by changing the level of signal at the terminal MT, without re-writing of the program.

The instruction fetching operation of the microcomputer shown in FIG. 3 will briefly be described below.

In the case of instruction fetch, the instruction/data switching signal DIS indicates an instruction and the multiplexer 40 selects the instruction address bus 50. Thus, an instruction address in outputted toward, the external address bus 54 and internal ROM address bus 55. Namely, the instruction address will be inputted into the emulation memory 32 and internal ROM 16.

At this time, on condition that L-level in stored in the mode selection register 44 and the terminal MT is also set L-level, the emulation mode becomes OFF and the signal EM becomes L-level. Due to the Instruction fetch, the signal READ (which is one of the status signals) from the CPU 12 becomes active. Thus, the memory control unit decades the address from the address bus 55. When this address is for the internal ROM area, the third chip enable signal CE3 and third memory read signal RD3 toward the internal ROM 16 become active. As a result, the instruction from the internal ROM 16 will be read into the CPU 12 through the instruction fetching bus 64. In other words, the CPU 12 will fetch and execute the instruction stored in the internal ROM 16.

On the other hand, when H-level is stored in the mode selection register 44 or the terminal MT is set H-level, the emulation mode is turned ON and the signal EM becomes H-level. Thus, the second chip enable signal CE2 and second memory read signal RD2 become active, rather than CE3 and RD3. Due to the instruction fetch, the signal DIS indicates the instruction and the signal READ becomes active. At this time, the instruction/data switching unit 42 selects the instruction fetching bus 64, rather than the data input bus 60. Thus, the instruction from the emulation memory 32 will be read into the CPU 12 through the external data bus 56, input/output pad cell 48, data bus 62, instruction/data switching unit 42 and instruction fetching bus 64. In other words, the CPU 12 will fetch and execute the instruction stored in the emulation memory 32 but not the internal ROM 16.

While the instruction is being read out from the emulation memory 32, the output of a tristate buffer 17 included in the internal ROM 16 becomes tristate. Therefore, any collision of data can be prevented in the instruction fetching bus 64.

As described above, in the form of FIG. 3, the instruction from the internal ROM is fetched and executed by the CPU 12 through the instruction fetching bus 64 as in the normal manner when the emulation mods is OFF (or the signal EM being at L-level) in the instruction fetch of the CPU 12. On the other hand, when the emulation mode is ON (or the signal EN being at H-level) in the instruction fetch of the CPU 12, the instruction from the emulation memory 32 but not the internal ROM 16 will be fetched and executed by the CPU 12 through the external data bus 56.

Before completion of the program development, the user uses the terminal MT or mode selection register 44 to turn the emulation mode ON and develops program while occasionally downloading the unfinished program into the emulation memory 32. After completion of the program development, the user stores the finished program in the internal ROM 16 (or prepares a mask pattern). The user then uses the terminal MT or mode selection register 44 to turn the emulation mode OFF. There will thus be provided a product chip in which the CPU 12 can operate based on the instruction from the internal ROM 16.

According to this embodiment, the external address and external data buses 54, 56 are shared between the external and emulation memories 30, 32, without provision of any address and data buses dedicated to the emulation memory 32. Therefore, an evaluation chip in which the CPU 12 can be operated by the instruction (or program) from the emulation memory which is not different in number of chips, pad layout and signal wiring from product chip in which its CPU 12 can be operated by the instruction from the internal ROM 16. In other word, the evaluation chip can be same as the product chip. Therefore, the product chip itself can be used to develop the program. This effectively eliminates a problem such that the product chip does not normally operate in such a manner as in the evaluation chip, due to different operational circumstance and signal timing between the evaluation and production (or actual) operations.

Taking a technique in which the external address and external data buses 54, 56 are shared between the external and emulation memories 30, 32, there can be provided such an advantage that the product and evaluation chips are of the same structure. However, such a technique raises another problem in that the speed of instruction reading-out from the emulation memory 32 in too late.

More particularly, the external address and external data buses 54, 56 are not dedicated to the emulation memory 32 (see 712 and 714 in FIG. 1B) and originally designed for the external memory 30. The reading-out of information from the external memory 30 usually has sufficient time. On the contrary, the CPU 12 must fetch and decode the instruction within one clock cycle. Therefore, the reading-out of instruction from the emulation memory 32 does not have sufficient time.

According to this embodiment, therefore, the chip enable signal CE2 and memory read signal RD2 different from the signal CE1 and RD1 for the external memory 30 are outputted toward the memory control unit 20. Thus, the instruction from the emulation memory 32 can be fetched and decoded within one clock cycle while the external address and external data buses 54, 56 are shared between the external and emulation memories 30, 32. Such a procedure will now be described in more detail with reference to FIG. 4 which shows a block diagram of signal waveform.

Referring to FIG. 4, the CPU 12 executes the following instructions:

| Instruction (1) | ld  | % r2, | 00 x 00 |
| Instruction (2) | ld  | % r1, | [% r9]  |
| Instruction (3) | add | % r4, | r1      |
| Instruction (4) | sub | % r5, | % r1    |

The instruction (1) is one for loading data 0×00 into a general-purpose register r2 in the CPU 12. The instruction (2) is one for loading data from the address of the external memory 30 which is an address stored in the general-purpose register r9 into a general-purpose register r1. In other words, the instruction (2) is one for loading the data from the external memory 30 into the general-purpose register r1. The instruction (3) is one for adding the data of a general-purpose register r4 to that of the general-purpose register r1. The instruction (4) is one for subtracting the data of the general-purpose register r1 from the data of a general-purpose register r5.

These instructions (1), (2), (3) and (4) are executed by a pipeline process as shown by B1 in FIG. 4. At B1, F designates instruction fetching: D instruction decoding; R register reading; A address computing; E instruction executing; and W writing to a register.

BCLK shown by B2 in FIG. 4 represents a bus clock for determining the bus cycle and is also an operational clock for the CPU 12 her in.

As shown by B3 in FIG. 4, an instruction is first read out from the emulation memory 32. Data is then read out from the external memory 30. An instruction is subsequently read out from the emulation memory 32.

In other words, as shown by B4, B5 and B6 in FIG. 4, addresses for reading out the instructions (1), (2) and (3) from the emulation memory 32 are outputted from the CPU 12 toward the external address bus 54 through the instruction address bus 50 and multiplexer 40. As shown by B7, B8 and B9, thus, an instruction corresponding to each of the addresses (or instruction data) is read out from the emulation memory 32 and then outputted to the external data bus 56. And then, these instructions are fetched and decoded by the CPU 12 from the external data bus 56 through the input/output pad cell 48, data bus 62, instruction/date switching unit 42 and instruction fetching bus 64.

At B10 in FIG. 4, a read-out address to the external memory 30 is outputted from the CPU 12 to the external address bus 54 through the data address bus 52 and multiplexer 40. This address is an address [% r9] specified by the instruction (2). As shown at B11, thus, the data is outputted from the external memory 30 toward the external data bus 56 and read cut by the CPU 12 through the input/output pad cell 48 the data bus 62, instruction/data switching unit 42 and data input bus 60.

At B12 in FIG. 4, an address used to read out the instruction (4) from the emulation memory 32 is outputted toward the external address bus 54. As shown at B13, an instruction corresponding to this address is outputted from the emulation memory 32 toward the external data bus 56.

When data is read out from the external memory 30, the first chip enable signal CE2 and first memory read signal RD1 are made active (or made L-level), as shown at B14 and B15 in FIG. 4. On the other hand, when an instruction is read out from the emulation memory 32, the second chip enable signal CE2 and second memory read signal RD2 are made active, as shown at B16 to B21.

At this time, as shown at B15, the signal RD1 becomes active in synchronization with the falling edge (trailing edge) of BCLK. On the other hand, as shown at B18 to B21, the signal RD2 becomes active in synchronization with the rising edge (leading edge) of BLCK. More particularly, the signal RD2 becomes active after a given delay time (which is a delay time in the delay element) from the rising edge of RCLK. In other words, the signal RD2 becomes active at a timing earlier than that of the signal RD1.

Consequently, the CPU 12 can fetch (F) and decode (D) an instruction within one clock cycle.

When an instruction is to read out from the emulation memory 32 using the signal RD1 that will be used for the other external memory 30, a problem will be raised in that the CPU 12 cannot fetch and decode the instruction within one clock cycle, since the signal RD1 is made active in synchronization with the trailing edge of BCLK. Particularly, the possibility of creating such a problem is further increased as the clock frequency of BCLK increases.

In such a case, the above-mentioned problem can be overcome, for example, by decreasing the clock frequency of BCLK during the evaluation, that is, when the instruction is read out from the emulation memory 32. However, this will raise another problem in that the clock frequency in the actual operation is different from that in the program development, thus resulting in the fact that the program properly operated on the program development does not properly operate in the actual operation. This will cancel the advantage of this embodiment that the same chip can be used on production and on evaluation.

To overcome such a problem, this embodiment of FIG. 4 provides the signals RD1 and RD2 different from each other. Since the signal RD2 in made active at an earlier time than the signal RD2 as shown at B18 to B21, the instruction from the emulation memory 32 can properly be fetched and decoded within one clock cycle. Therefore, the development of program will be able to be performed with the same clock frequency an in the actual operation. Even when the finished program is stored in the internal ROM 16 after completion of the program development, the program will be able to operate without any problem. Therefore, the advantage of this embodiment that the product and evaluation chips can have the same configuration through the common external address and external data buses 54, 56 can be accomplished.

Since at B22 in FIG. 4, await is inserted into the readout of data from the external memory 30, the pipeline processing in the CPU 12 is in its stalled state. The external address and external data buses 54, 56 may be connected to any of various external memories 30 which are different in reading or writing speed. Thus, the wait can be inserted into the period during which the signals CR1 and RD1 are active. Therefore, the external address and external data buses 54, 56 can deal with various external memories 30 which are different in reading or writing speed.

Relating to the emulation memory 32 to which the signals CE2 and RD2 are outputted, an instruction must be read out within the aforementioned one clock cycle. Unlike the signals CE1 and RD1, the wait will not be inserted Into the period during which the signals CR2 and RD2 are active.

Although FIG. 3 shows the selection of ON/OFF of the emulation mode through the one-bit mode selection terminal MT, the terminal MT may be modified to be of plural-bit for selecting any other mode.

For example, FIG. 5 shows a two-bit terminal MT. When the terminal MT is set "00", there will be selected a mode of performing the boot from the emulation memory 32. More particularly, in this selected mode, the emulation memory 32 is first accessed by the CPU 12 after reset (or the emulation mode being ON). When the terminal MT is set "01", the mode of performing the boot from the emulation memory 32 is selected after information has been transferred from the external memory 30 to the emulation memory 32. When the terminal MT is set "10", a mode of performing the boot from the internal ROM 16 is selected. Namely, in this mode, the internal ROM 16 is first accessed by the CPU 12 after reset When the terminal MT is set "11", a mode of performing the boot from the external memory 30 is selected. Namely, in this mode, the external memory 30 is first accessed by the CPU 12 after reset.

By selecting any of various modes through the terminal MT in such a manner, the program can more effectively be developed.

For example, the terminal MT is set "00" during the development of program. The boot is always performed from the emulation memory 32 after reset. Therefore, the CPU 12 will be operated according to the program (or instruction) stored in the emulation memory 32. The development of the program can be implemented while occasionally downloading the program into the emulation memory 32.

The terminal MT is set "10" after the finished program has been stored in the internal ROM 16 after completion of the program development. Thus, the boot will always be performed from the internal ROM 16 after reset. This enables the microcomputer to be used as a product chip. In other words, the evaluation chip will be able to be used as a product chip merely by changing the setting in the terminal MT from "00" to "10".

When the user wants to boot from the external memory 30 after reset, the terminal MT may only be set "11". There may be a user who wants to store a program to be first started after resetting the external memory 30 on the user's system board. Such a user does not require the internal ROM, but wants a microcomputer of such a type that it does not includes any internal ROM 16 for reducing the manufacturing cost for electronic equipment. Even in such a case, this embodiment can easily satisfy the user's requirement merely by setting the terminal MT "11".

A mode used when the terminal MT is "01", which will be referred to OTP (OneTimeProm) mode, will now be described in detail with reference to FIG. 6.

In the OTP mode, after reset, the program (or information) is transferred from the flash memory (which is one of the external memories) to the emulation memory 32 through a DMA controller 80 included in the microcomputer 10, an shown at C1 in FIG. 6. The emulation memory 32 is formed by a high-speed SRAM for increasing the processing speed. In case the power is shut off, the program stored in the emulation memory 32 will be disappeared. Therefore, the program must be downloaded into the emulation memory 32 each time when the power is turned off. This makes the program development complicated.

In such a case, the terminal MT is set "01" according to this embodiment. At this time, the program stored in the flash memory (REPROM) 31 will automatically be transferred to the emulation memory 32 after reset. Since the flash memory 31 is non-volatile, the program stored therein will not be disappeared even when the Dower is shut off. Therefore, the program will not be re-downloaded into the emulation memory 32 even after the power has been shut off. This improves the efficiency in the development of program.

By providing the plural-bit terminal MT for selecting any of various different modes, the microcomputer can satisfy the requirements of various different users while increasing the efficiency and flexibility in the development of program.

2. ELECTRONIC EQUIPMENT

Some forms of electronic equipment including the microcomputer according to this embodiment will now be described.

Figure 7A:
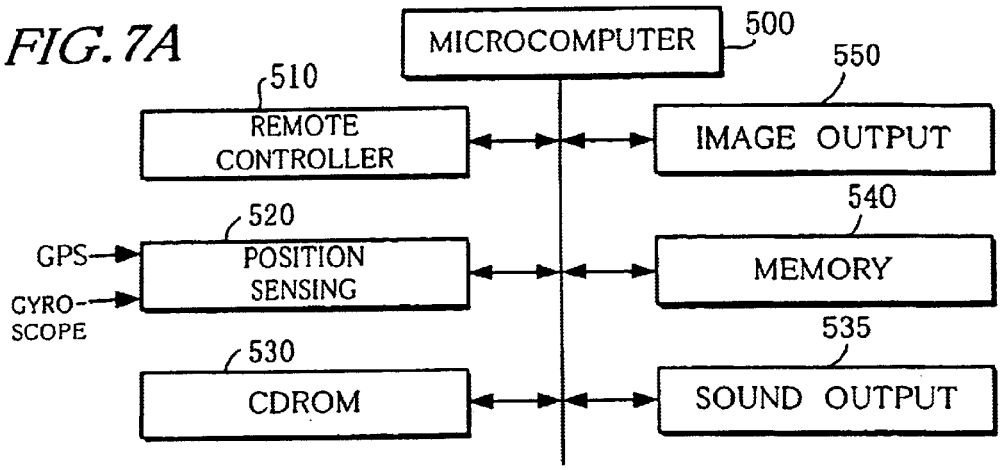
FIGS. 7A, 7B and 7C are internal block diagrams of various forms of electronic equipment.
Figure 8A:
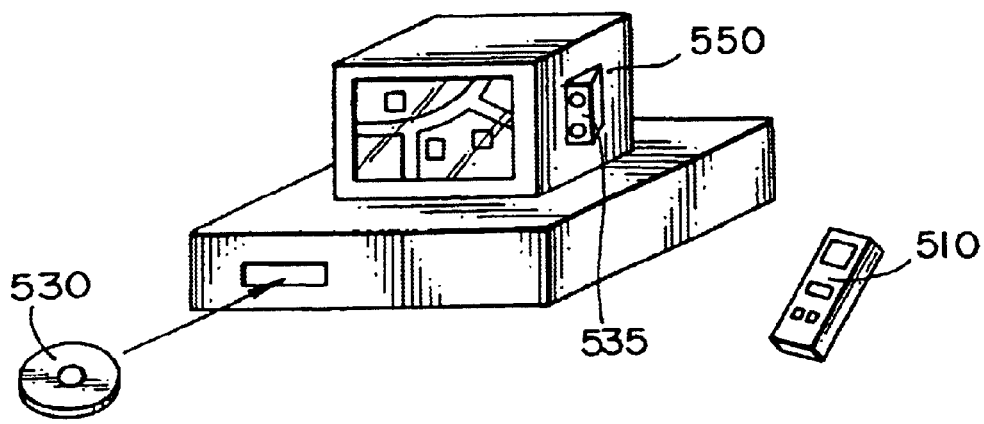
FIGS. 8A, 8B and 8C show the appearances of various forms of electronic equipment.

For example, FIG. 7A shows an internal block diagram of a car navigation system which is one form of electronic equipment while FIG. 8A shows its appearance. The car navigation system is controlled through a remote controller 510 and comprises a position sensing section 520 for sensing the position of a motorcar according to Information from GPS or gyroscope. Map and other information have been stored in a CDROM (or information storage medium) 530. A memory 540 is used to provide a working area for processing images and sounds. A generated image is displayed to a driver through an image output section 550. A generated car navigation guide voice is outputted toward the driver through a sound output section 510. A microcomputer 500 receives and processes information from various information source such as the remote controller 510, position sensing section 520, CRROM 530 and the like, the processed information being outputted through the image and sound output sections 550, 530 and other devices.

Figure 7B:
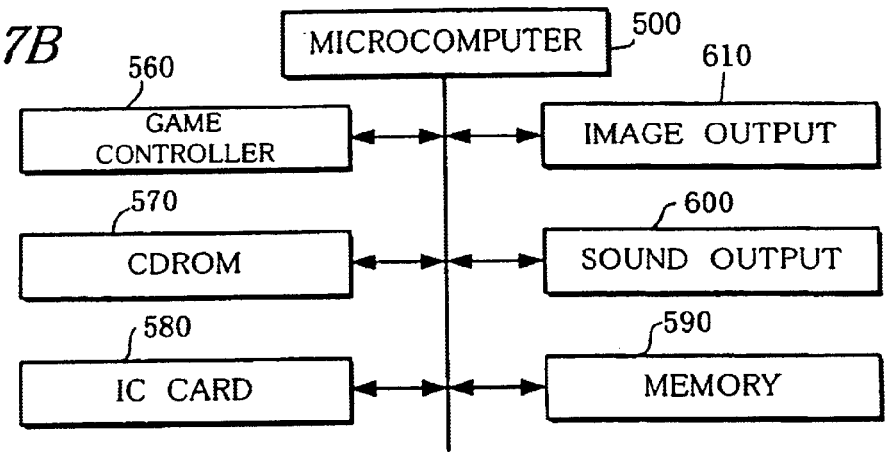
Figure 8B:
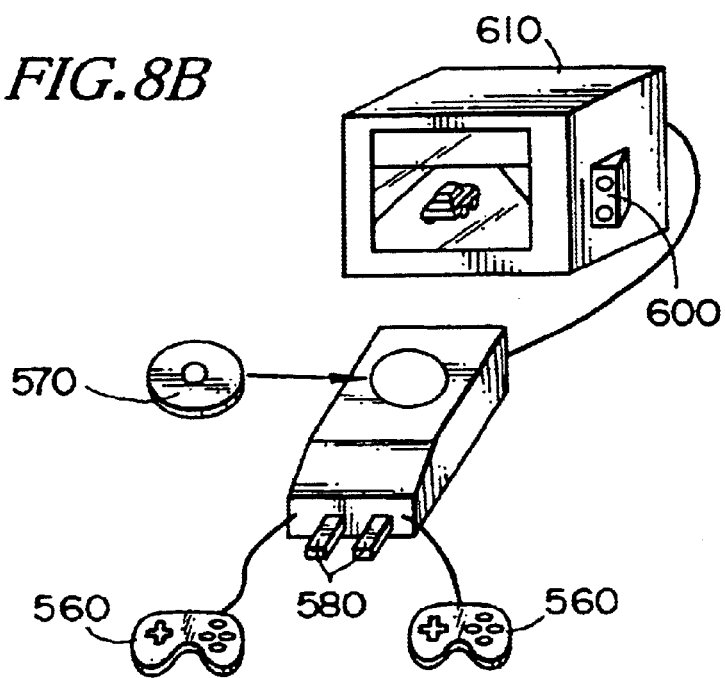

FIG. 7B shows an internal block diagram of a game machine which is one form of electronic equipment while FIG. 8B shows its appearance. This game machine generates game images and sounds according to the player's control information from a game controller 560, the game program from a CDROM 570, the player's information from an IC card 580 and other information. The generated images and sounds are then outputted through image and sound output sections 610, 600.

Figure 7C:
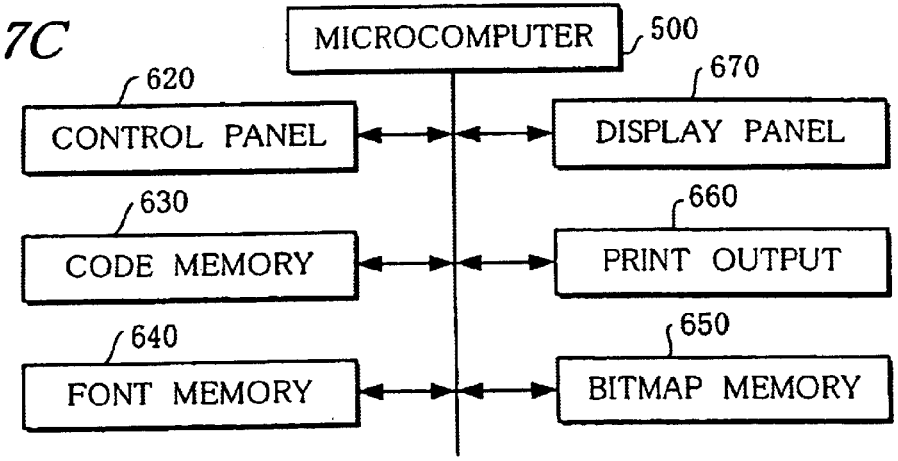
Figure 8C:
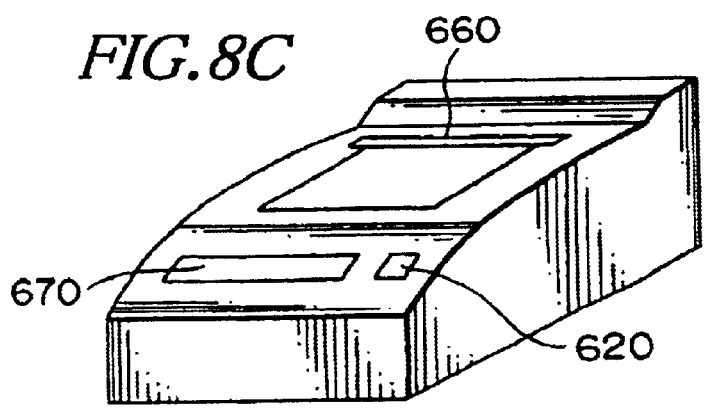

FIG. 7C shows an internal block diagram of a printer which is one form of electronic equipment while FIG. 8C shows its appearance. The printer generates a printing image according to the control information from a control panel 620 and character information from code memory 630 and font memory 640 while using a bitmap memory 650 as a working area. The generated image is then outputted through a print output section 660. The printer informs the user of the printer's state and mode through a display panel 670.

According to this embodiment, the same microcomputer chip to be incorporated into the electronic equipment (or system board) can be used for both the evaluation and production (or actual) operations. The same sockets for a chip of the microcomputer and wirings to the microcomputer can be used in both the evaluation and production of the microcomputer. This can reduce the manufacturing cost in the electronic equipment. This embodiment can further overcome such a problem that the chip properly operated during the evaluation of the microcomputer will not properly operate during the production or actual operation. The development of program performed in such a state that the microcomputer has been incorporated into the electronic equipment can be improved in efficiency, resulting in reduction of the program development time and manufacturing cost of electronic equipment.

The electronic equipment to which the microcomputer of the present invention can be applied may include portable telephones (or cellular phones) PHS's, pagers, portable information terminals, digital cameras, hard-disc devices, optical memory disk (CD, DVD) devices, magneto-optical disk (MO) devices, audio instruments, electronic notepads, electronic desk-top calculators, a POS terminal, a device provided with a touch panel, a projector, a dedicated wordprocessor, personal computers, television sets, viewfinder or video tape recorders of monitor type and others.

The present invention is not limited to the illustrated embodiments, but may be carried out in any of various modification can be conceived within the scope of the invention.

For example, the technique of connecting the processor (CPU) bus to the external bus when the emulation mode is ON is not limited to the form described in connection with FIG. 3, but may be carried out in any of various other techniques.

Although it is particularly preferred that the emulation mode is set ON or OFF through the mode selection register or mode selection terminal, any other technique may he used in the present invention.

Although it is particularly preferred that the first control signal for controlling the external memory and the second control signal for controlling the emulation memory are as shown in FIGS. 3 and 4, the present invention will not be limited to such signals.

The structure of the electronic equipment is not limited to these described in connection with FIGS. 7A to 8C, but may be carried out in any of various other forms.

What is claimed is:

1. A microcomputer for performing information processing, comprising:
    a processor for executing instructions;
    external terminals for an external bus being connectable to both an emulation memory and at least one external memory other than said emulation memory, said external terminals being connected to at least said emulation memory through said external bus when the microcomputer is in an emulation mode and being connected to said external memory without being connected to said emulation memory when said microcomputer is not in said emulation mode; and
    bus control means for connecting a bus of said processor to said external bus so that an access of said processor to an internal memory will be switched to an access to said emulation memory through said external bus when said microcomputer is in said emulation mode,
    wherein the microcomputer further comprises memory control means for outputting a first control signal for controlling said external memory connected to said external bus and a second control signal for controlling said emulation memory connected to said external bus, said second control signal being different from said first control signal.

2. The microcomputer according to claim 1, further comprising a mode selection terminal for selecting ON or OFF of the emulation mode.

3. The microcomputer according to claim 1, further comprising a mode selection register for storing information used to select ON or OFF of the emulation mode, and being accessible by said processor.

4. The microcomputer according to claim 1,
    wherein an address bus of said processor is connected to an external address bus and an address bus of said internal memory without being dependent on ON/OFF of the emulation mode, and
    wherein a data bus of said processor is connected to an external bus when the emulation mode becomes ON.

5. The microcomputer according to claim 1,
    wherein said second control signal includes a second memory read signal which becomes active at a timing earlier than that of a first memory read signal included in said first control signal.

6. The microcomputer according to claim 1, further comprising a mode selection terminal for selecting a first mode and a second mode, said emulation memory being first accessed by said processor after reset in said first mode, and said internal memory being first accessed by said processor after reset in said second mode.

7. The microcomputer according to claim 1,
    wherein said mode selection terminal is capable of selecting a third mode in which said external memory is first accessed by said processor after reset.

8. The microcomputer according to claim 1,
    wherein said mode selection terminal is capable of selecting a fourth mode in which information is transmitted from said external memory to said emulation memory after reset and thereafter said emulation memory is first accessed by said processor.

9. Electronic equipment comprising:
    the microcomputer as defined in claim 1;
    an input source of information to be processed by said microcomputer; and
    an output device for outputting the information processed by said microcomputer.

10. Electronic equipment comprising:
    the microcomputer as defined in claim 1;
    an input source of information to be processed by said microcomputer; and
    an output device for outputting the information processed by said microcomputer.

11. Electronic equipment comprising:
    the microcomputer as defined in claim 1;
    an input source of information to be processed by said microcomputer; and
    an output device for outputting the information processed by said microcomputer.

12. Electronic equipment comprising:
    the microcomputer as defined in claim 1;
    an input source of information to be processed by said microcomputer; and
    an output device for outputting the information processed by said microcomputer.

13. Electronic equipment comprising:
the microcomputer as defined in claim 1,
an input source of information to be processed by said microcomputer; and
an output device for outputting the information processed by said microcomputer.

14. Electronic equipment comprising:
the microcomputer as defined in claim 1;
an input source of information to be processed by said microcomputer; and
an output device for outputting the information processed by said microcomputer.

15. Electronic equipment comprising:
the microcomputer as defined in claim 1,
an input source of information to be processed by said microcomputer; and
an output device for outputting the information processed by said microcomputer.

16. Electronic equipment comprising:
the microcomputer as defined in claim 1;
an input source of information to be processed by said microcomputer; and
an output device for outputting the information processed by said microcomputer.

17. Electronic equipment comprising:
the microcomputer as defined in claim 1;
an input source of information to be processed by said microcomputer; and
an output device for outputting the information processed by said microcomputer.

18. An emulation method for a microcomputer comprising:
executing instructions by a processor, and
sending external signals for an external bus being connectable to an emulation memory and at least one external memory other than said emulation memory, said external terminals being connected to at least said emulation memory through said external bus when the microcomputer is in an emulation mode and being connected to said external memory without being connected to said emulation memory when said microcomputer is not in said emulation mode,
connecting a bus of said processor to said external bus by a bus controller so that an access of said processor to an internal memory will be switched to an access to said emulation memory through said external bus when said microcomputer is in said emulation mode,
outputting a first control signal by a memory controller for controlling said external memory connected to said external bus, and
outputting a second control signal by said memory controller for controlling said emulation memory connected to said external bus, said second control signal being different from said first control signal, said second control signal including a memory read signal,
wherein said external bus is shared between said emulation memory, and said external memory and said emulation memory is accessed through said external bus when the microcomputer is in said emulation mode, thereby causing said processor to operate according to information read out from said emulation memory, and
wherein said processor is operated according to information read out from said internal memory when the microcomputer is not in said emulation mode.

19. A microcomputer which performs information processing, comprising:
a processor that executes instructions;
external terminals for an external bus being connectable to both an emulation memory and an external memory other than said emulation memory, said external terminals being connected to at least said emulation memory through said external bus when said microcomputer is in an emulation mode and being connected to said external memory without being connected to said emulation memory when said microcomputer is not in said emulation mode;
an internal memory that stores said instructions; and
a bus controller that connects a bus of said processor to said external bus and switches an access of said processor to said internal memory to an access to said emulation memory through said external bus, when said microcomputer is in said emulation mode,
wherein said microcomputer further comprises a memory controller which is connectable to said emulation memory and said external memory, and outputs a first control signal for controlling said external memory and a second control signal for controlling said emulation memory, said second control signal being different from said first control signal, and
wherein said second control signal includes a second memory read signal which becomes active at a timing earlier than that of a first memory read signal included in said first control signal.

20. The microcomputer according to claim 19, further comprising:
a mode selection terminal that selects ON or OFF of the emulation mode.

21. The microcomputer according to claim 19, further comprising:
a mode selection register that is accessible by said processor and stores information used to select ON or OFF of the emulation mode.

22. The microcomputer according to claim 19,
wherein an address bus of said processor is connected to an external address bus and an address bus of said internal memory without dependent on ON/OFF of the emulation mode, and
wherein a data bus of said processor is connected to an external data bus when the emulation mode becomes ON.

23. The microcomputer according to claim 19, further comprising:
a mode selection terminal that selects a first mode and a second mode, said emulation memory being first accessed by said processor after reset in said first mode, and said internal memory being first accessed by said processor after reset in said second mode.

24. The microcomputer according to claim 23,
wherein said mode selection terminal is capable of selecting a third mode in which said external memory is first accessed by said processor after reset.

25. The microcomputer according to claim 23,
wherein said mode selection terminal is capable of selecting a fourth mode in which information is transmitted from said external memory to said emulation memory after reset and thereafter said emulation memory is first accessed by said processor.

* * * * *